US 8,253,463 B1

United States Patent
Chromczak et al.

(10) Patent No.: US 8,253,463 B1
(45) Date of Patent: Aug. 28, 2012

(54) PULSE WIDTH CONTROL CIRCUITRY

(75) Inventors: Jeffrey Christopher Chromczak, Brownsville (CA); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 267 days.

(21) Appl. No.: 12/721,488

(22) Filed: Mar. 10, 2010

(51) Int. Cl.
*H03K 5/04* (2006.01)

(52) U.S. Cl. ........................................ 327/176; 327/172

(58) Field of Classification Search ........................ None
See application file for complete search history.

(56) References Cited

U.S. PATENT DOCUMENTS

| | | | |
|---|---|---|---|
| 5,278,456 A * | 1/1994 | Bechade et al. | 327/175 |
| 6,288,953 B1 * | 9/2001 | Kwak | 365/189.05 |
| 7,030,671 B2 * | 4/2006 | Park | 327/172 |
| 7,088,136 B1 | 8/2006 | Lewis | |
| 7,120,617 B2 * | 10/2006 | Nomura et al. | 706/26 |
| 7,463,057 B1 | 12/2008 | Rahim et al. | |
| 7,583,103 B2 | 9/2009 | Lewis et al. | |
| 8,055,964 B2 * | 11/2011 | Tokunaga | 714/729 |
| 2005/0268191 A1 * | 12/2005 | Shin | 714/726 |

OTHER PUBLICATIONS

Friedrich et al., "Design of the Power6 Microprocessor," IEEE International Solid-State Circuits Conference, Paper 5.1, Feb. 12, 2007.
Lewis, David, et al. U.S. Appl. No. 12/060,795, filed Apr. 1, 2008.

* cited by examiner

*Primary Examiner* — Cassandra Cox
(74) *Attorney, Agent, or Firm* — Treyz Law Group; Jason Tsai

(57) ABSTRACT

Integrated circuits with pulse latches are provided. Pulse latches are controlled by clock pulse signals. The clock pulse signals are generated by pulse generators. The pulse generators are controlled by adaptive pulse width control circuitry to provide clock pulse signals with a minimum pulse width and with sufficient margin to tolerate for process, voltage, and temperature variations. The pulse width control circuitry may include a replica pulse generator, a test data generation circuit, a test latch, and a pulse width calibration circuit. The replica pulse generator controls the test latch. The test latch may attempt to latch the test data. The pulse width control circuit may determine if the test latch properly latches the test data with the given pulse width. The pulse width control circuit adjusts the pulse generator dynamically to provide a minimized pulse width.

20 Claims, 12 Drawing Sheets

PULSE WIDTH CONTROL CIRCUITRY

BACKGROUND

This relates generally to integrated circuits, and more particularly, to integrated circuits with pulse latches.

Pulse latches can be used to implement time borrowing schemes in integrated circuits. Time borrowing schemes may allow circuit performance to be improved by optimizing timing performance along critical circuit paths.

Pulse latches are controlled by clock pulse signals. Care must be taken to ensure that the width of the clock pulse signals is not too narrow or too wide. If a pulse latch clock pulse is too wide, a logic circuit that incorporates the pulse latches may exhibit undesirable race through behavior. If the clock pulse for a pulse latch is too narrow, the pulse latches may not properly latch input data.

Although accurate pulse width control is desirable for proper circuit performance, it can be difficult to guarantee that pulse latch clock pulses are generated satisfactorily, particularly in view of environmental factors such as process, voltage, and temperature variations.

It would therefore be desirable to be able to provide integrated circuits with improved pulse latch clock circuitry.

SUMMARY

An integrated circuit may be provided with sequential logic circuitry. The sequential logic circuitry may include pulse latches. The pulse latches may be controlled by clock pulse signals. The width of the clock pulse signal may be adjusted dynamically in real time to compensate for process, voltage, and temperature (PVT) variations on the integrated circuit.

The clock pulse signal may be generated by a pulse generator. The clock pulse signal may have a programmable pulse width. Adaptive clock pulse width control circuitry may be used to identify a pulse width for the clock pulse signal that is sufficiently narrow to satisfy hold time requirements and that is sufficiently wide to ensure that the pulse latches will latch data properly.

The pulse generator may be controlled by a pulse width control signal (e.g., to adjust the pulse width of the clock pulse signals). The pulse width control signal may be generated by the adaptive pulse width control circuitry. The adaptive pulse width control circuitry may control multiple pulse generators (e.g., slave pulse generators) simultaneously. Each slave pulse generator may generate a respective clock pulse signal that controls a respective group of pulse latches in a given block of sequential logic circuitry.

The adaptive pulse width control circuitry may include a replica (master) pulse generator and pulse width calibration circuitry. The replica pulse generator may be a duplicate or other representative version of the slave pulse generators. When formed in this way, the performance of the replica pulse generator will track the performance of each of the slave pulse generators when the slave pulse generators are influenced by PVT variations.

The adaptive pulse width control circuitry may include a test data generation circuit, a test latch, and a pulse width control circuit. The pulse generator may receive an original clock signal (e.g., a square wave clock) to generate a clock pulse signal (i.e., a train of pulse latch clock pulses). The clock pulse signal may be used to control (enable) the test latch.

The test data generation circuit may provide test data to an input of the test latch. The test latch may or may not latch the test data properly depending on the duration of the pulse width. The test latch may provide latched data at its output. Pulse width control circuit may include an error detection circuit that compares the test data with the latched data. The pulse width control circuit may produce a pulse width control signal that directs the pulse generator to widen the pulse width if the test data and the latched data are not equal (i.e., if the latched data contains errors) or to shorten the pulse width if the test data and the latched data match (i.e., if the latched data is error free).

With one suitable arrangement, the test data generation circuit includes a delay circuit and a test inverter. The delay circuit receives data from the output of the test latch. The delay circuit has an output that is connected to an input of the test inverter. The inverter has an output that is connected to the input of the test latch.

The pulse width control circuit may also include a reference latch such as a positive edge-triggered flip-flop (ETFF). The flip-flop may have an input that receives test data from the test data generation circuit. The flip-flop may be clocked using the original (square wave) clock so that it always samples the test data correctly. The flip-flop may therefore provide correctly sampled data for use as a reference data stream at its output.

The error detection circuit may be implemented using a logic gate such as an exclusive OR (XOR) gate. The XOR gate may have inputs that are connected to the output of the test latch and the output of the flip-flop. The XOR gate may compare the latched data and the correctly sampled data to determine whether the test latch latches the test data properly. The XOR gate may output a "1" to indicate the presence of an error (e.g., to indicate that the latched data is not equal to the correctly sampled data) or may output a "0" to indicate the absence of errors (e.g., to indicate that the latched data is equal to the correctly sampled data and is therefore error free).

The XOR gate may have an output that is connected to a filter such as a low-pass filter. The filter may have an output that is connected to a counting circuit such as an up-down counter. The up-down counter may be controlled by an inverted clock signal. The up-down counter may have an output that provides the pulse width control signal. The pulse width control signal may be equal to or may be based on a count value that is maintained by the counting circuit. If the error detection circuit indicates that an error is present, the counter may increment its current count value (i.e., the counter may count up). This increases the value of the pulse width control signal. If the error detection circuit indicates that no error is present, the counter may count down to decrease the value of the pulse width control signal. The pulse width control signal may be adjusted in this way to minimize the pulse width while ensuring that the pulse width remains sufficiently large to satisfactorily latch data in the pulse latches.

The pulse generator may include a variable delay circuit. The variable delay circuit may be adjusted to produce clock pulse signals with the desired pulse width. The variable delay circuit may be implemented using configurable inverter chains, current-starved inverter chains, shunt capacitor delay elements, or other circuits that produce variable delay. The variable delay circuit may be controlled by the pulse width control signal and, if desired, by static control signals produced at the outputs of memory cells that have been loaded with control data (e.g., random-access-memory cells or other memory elements that have been loaded with configuration bits). The pulse width control signal may be a dynamic signal that is adjusted in real time to compensate for any variation in silicon characteristics and in operating conditions.

During operation, the pulse generator may produce clock pulses based on both the static control signals and the dynamic control signals at its control inputs. If desired, the adaptive pulse width control circuitry may serve as a master control circuit that controls the operation of multiple slave pulse generators. In this type of arrangement, the dynamic control signal that is produced by the adaptive pulse width control circuit may be distributed to multiple slave pulse generators each of which produces a corresponding pulse latch clock pulse at a respective output. Each pulse latch clock pulse that is produced in this way may be applied to the clock inputs of pulse latches in a respective group of pulse latches.

Further features of the present invention, its nature and various advantages will be more apparent from the accompanying drawings and the following detailed description.

DETAILED DESCRIPTION

Integrated circuits with logic circuitry are provided. The integrated circuits may include combinational logic circuits and sequential logic circuits. Combinational logic circuits include circuits that generate deterministic output values based on signals that are presented at their inputs. For example, a logic gate such as a two-input NAND gate is a combinational logic gate. The two-input NAND gate may produce a logic "0" or a logic "1" at its output based on the values that are supplied to its two inputs.

Sequential logic circuits may include circuits that generate output values based not only on their present input values, but also on the history of previous input values. This history of input values in sequential logic circuits is typically captured by storage elements such as data registers, pulse latches, etc. These storage elements may be controlled by control signals such as clock signals. For example, data registers are often controlled by regular clock signals (e.g., square wave clock signals with 50% duty cycles) while pulse latches may be controlled by clock pulse signals (e.g., pulsed clock signals with less than 50% duty cycles or pulsed clock signals with more than 50% duty cycles).

Figure 1:
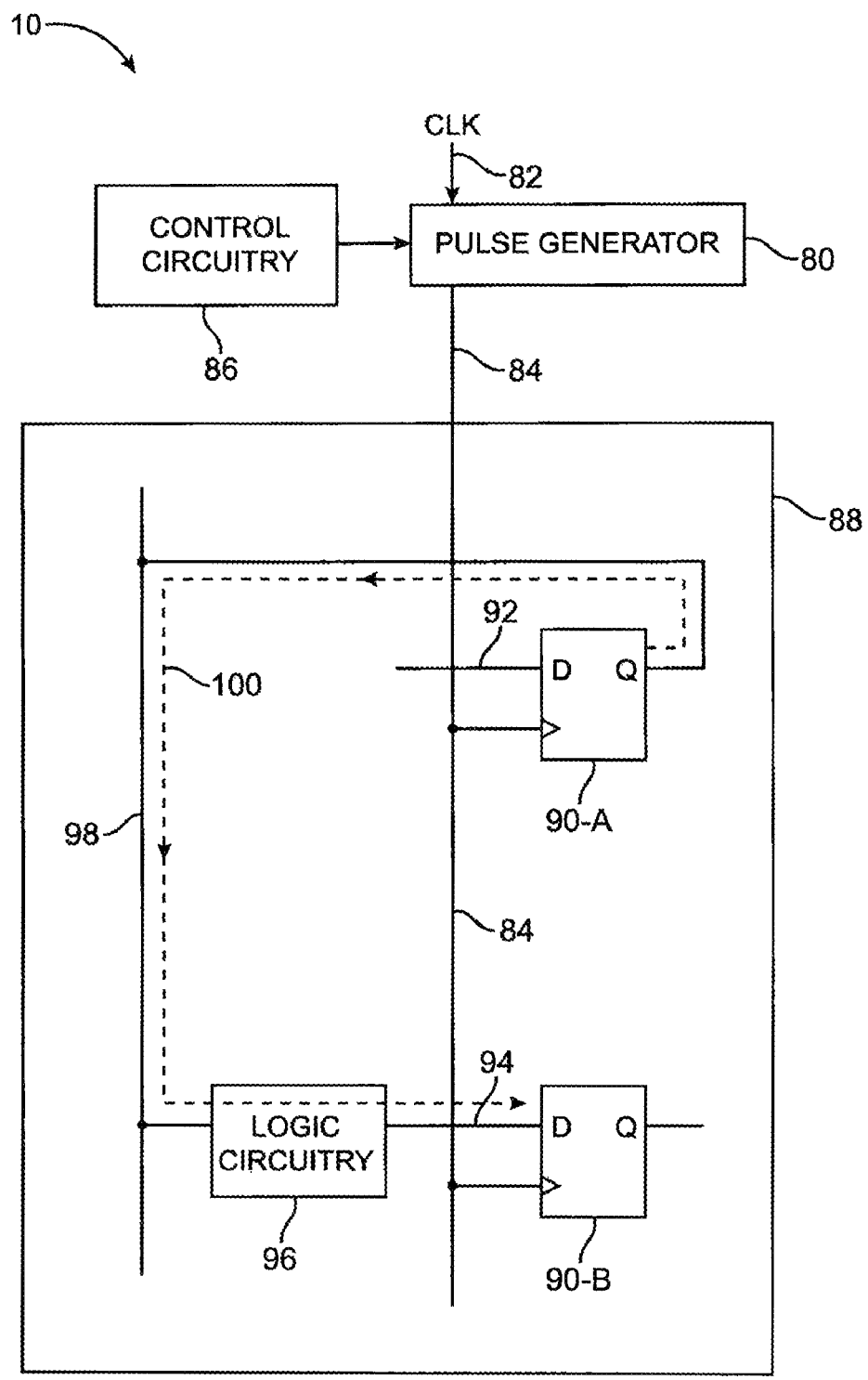
FIG. 1 is a circuit diagram showing how there may be a potential race through condition in a logic circuit when using pulse latches in accordance with an embodiment of the present invention.

An integrated circuit such as integrated circuit 10 of FIG. 1 may include sequential logic circuit 88. Sequential logic circuit 88 may include pulse latches such as pulse latches 90-A and 90-B. Sequential logic circuit 88 may include at least one pulse latch. The pulse latches may each have a control input that is connected to control line 84. Control line 84 may be connected to a pulse generator such as pulse generator 80. Pulse generator 80 may receive an original clock signal such as clock signal CLK over clock line 82. The original clock signal may have a 50% duty cycle (as an example). Pulse generator 80 may use the original clock signal to generate a clock pulse signal on control line 84. The clock pulse signal may exhibit pulses that have a desired pulse width and that are generated at regular time intervals. The pulse width of the clock pulse signal is typically less than half the period of the original clock signal (i.e., less than 50% duty cycle).

Pulse generator 80 may be controlled by control circuitry such as control circuitry 86. Control circuitry 86 may be used to adjust the pulse width of the clock pulse signal.

Proper functioning of the sequential logic circuit requires sufficient control of the clock pulse signal (e.g., accurate control of the pulse width is desired). A wider pulse width may be desirable to enable time borrowing. Time borrowing is a technique that is often used in sequential logic circuits to increase operating frequencies. The wider pulse width may, however, result in race conditions or "race through." It may therefore be desirable to be able to generate a clock pulse signal that has a minimized pulse width while allowing the pulse latches to latch data properly.

Modern integrated circuits are often affected by process variations. In practice, operating conditions such as voltage and temperature may also affect design criteria. As a result, the desired pulse width may change in the presence of process, voltage, and temperature (PVT) variations. It may therefore be desirable to be able to generate clock pulse signals with an adaptive pulse width that can be adjusted in real time.

FIG. 1 shows a circuit diagram that includes logic circuit 88 to illustrate the race through concept. As described previously, pulse latches 90-A and 90-B may be controlled by the clock pulse signal that is supplied over control line 84. The pulse latches may each have an input and an output as indicated by terminals D and Q, respectively. The inputs of latches 90-A and 90-B may be connected to lines 92 and 94, respectively.

In a typical sequential logic circuit, the pulse latches are coupled in a chain. Logic circuitry is placed between adjacent pulse latches in the chain. For example, latch 90-A has an output that is connected to path 98. Path 98 may be connected to logic circuitry such as logic circuitry 96. Logic circuitry 96 may be connected to line 94. The series connection of path 98, logic circuitry 96, and line 94 serves to couple latch 90-A to adjacent latch 90-B. This series connection may serve as a path (as indicated by dotted path 100) for data to race through from latch 90-A to latch 90-B in a given clock cycle.

Figure 2:
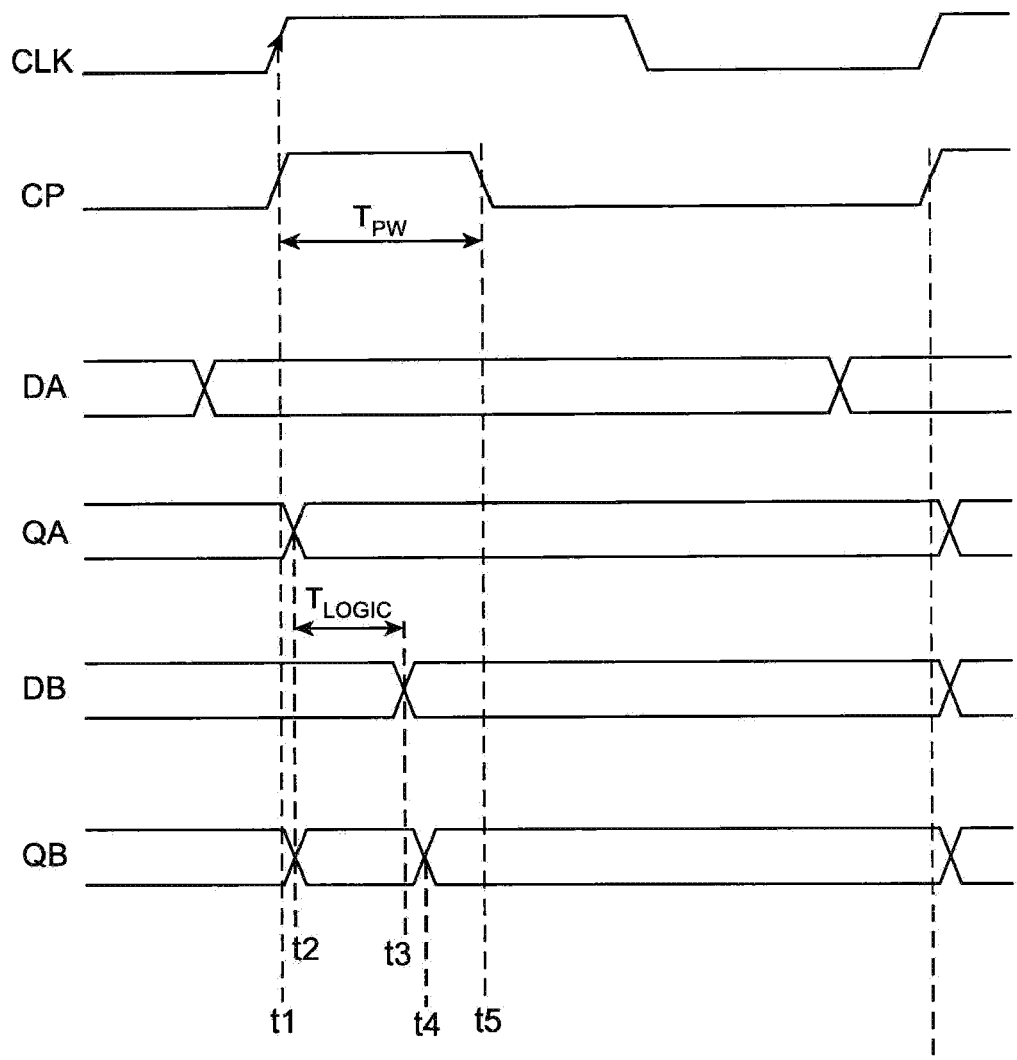
FIG. 2 is a timing diagram illustrating a race through condition in the logic circuit shown in FIG. 1 in accordance with an embodiment of the present invention.

FIG. 2 shows a timing diagram that illustrates race through in detail. At time t1, original clock signal CLK is raised high. This triggers pulse generator 80 to generate a clock pulse signal CP that has pulse width Tpw (e.g., from time t1 to time t5). At time t1, first and second data values may be presented at the input of latch 90-A (DA) and at the input of latch 90-B (DB), respectively. At time t2, the output of latch 90-A (QA)

and the output of latch 90-B (QB) may change to the first and second data values, respectively. The time period from time t1 to time t2 may reflect the time it takes for the pulse latch to change its output in response to a rising clock signal. The time period from time t1 to t2 may therefore be referred to as a clock-to-output time.

It is desirable for the outputs of the pulse latches to maintain their values after time t2 for the remainder of the clock period. When QA changes at time t2, this change in data value may propagate (race) through logic circuitry 96. The propagation delay through logic circuitry 96 may have duration $T_{LOGIC}$ (see, e.g., FIG. 2). As a result, at time t3 (e.g., delay $T_{LOGIC}$ after time t2), DB may change undesirably to an incorrect value. This change in DB will cause an undesirable change in QB at time t4. Clock pulse signal CP falls low at time t5.

In this example, the newly latched data races through logic circuitry 96 and changes the output of the following pulse latch. This race through can be prevented by shortening pulse width Tpw such that clock pulse signal CP falls low prior to time t3. By the time the new data propagates through logic circuitry 96, the following pulse latch is no longer enabled and can no longer change its output, because clock signal CP is deasserted. A narrower pulse width may therefore be desirable to prevent race through.

Figure 3:
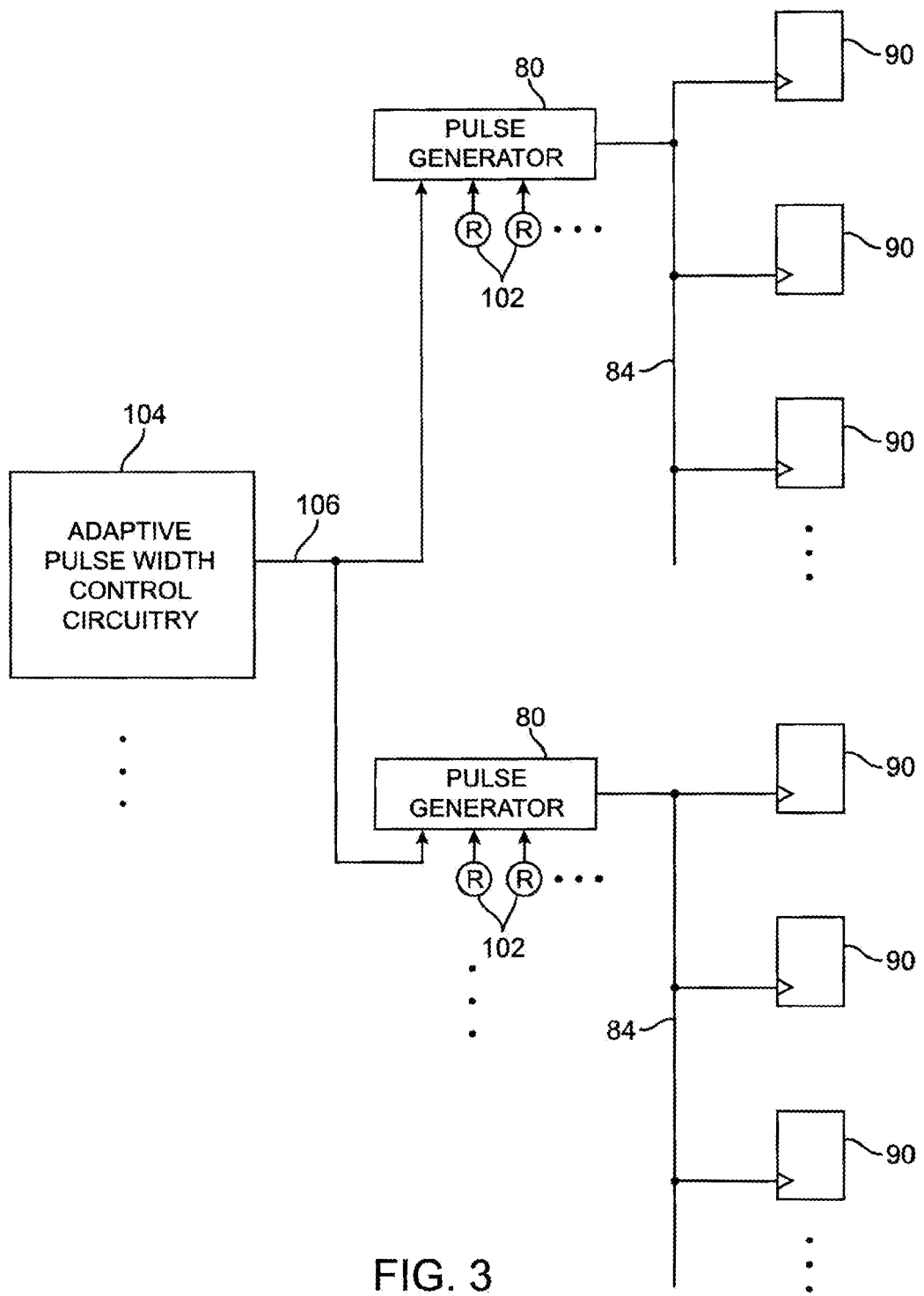
FIG. 3 is a circuit diagram showing how multiple pulse generators may be controlled by adaptive pulse width control circuitry in accordance with an embodiment of the present invention.

Integrated circuit 10 may include multiple pulse generators 80, as shown in FIG. 3. More than two pulse generators may be used, if desired. Each pulse generator 80 may control multiple associated pulse latches 90. Each pulse generator 80 may generate clock pulse signal CP over line 84 to control associated pulse latches 90.

Each pulse generator 80 may be controlled by configuration bits (e.g., static control signals) stored in storage elements such as random access memory (RAM) cells 102. The configuration bits can be used to set a nominal pulse width for pulse latch clock pulse. The values of the configuration bits may be determined without any particular knowledge of the silicon characteristics of the die on which integrated circuit 10 is formed (as an example). RAM cells 102 may be configurable RAM (CRAM) cells that are loaded with configuration data (as an example). Any number of cells 102 may be used to control generator 80. If desired, storage elements 102 may be implemented using nonvolatile memory elements (e.g., fuses, antifuses, electrically-programmable read-only memory elements, etc.).

Each pulse generator 80 may be connected to adaptive clock pulse width control circuitry such as adaptive clock pulse width control circuitry 104. Adaptive clock pulse width control circuitry 104 may provide a dynamic pulse width control signal over pulse control line 106 to each of the associated pulse generators 80. The pulse width control signal may be a dynamic control signal (e.g., to make fine adjustments) that can be adjusted in real time to obtain the desired pulse width. The value of the pulse width control signal may be continuously updated during actual operation of integrated circuit 10 to counteract pulse width fluctuations resulting from PVT variations.

More than one block of control circuitry 104 may be used to control a respective portion of logic. For example, there may be multiple blocks of control circuitry 104 that are used to control respective logic array blocks (LAB) on a programmable integrated circuit. If desired, there may also be multiple blocks of control circuitry 104 within each logic array block to provide pulse generators 80 with different pulse widths.

Figure 4:
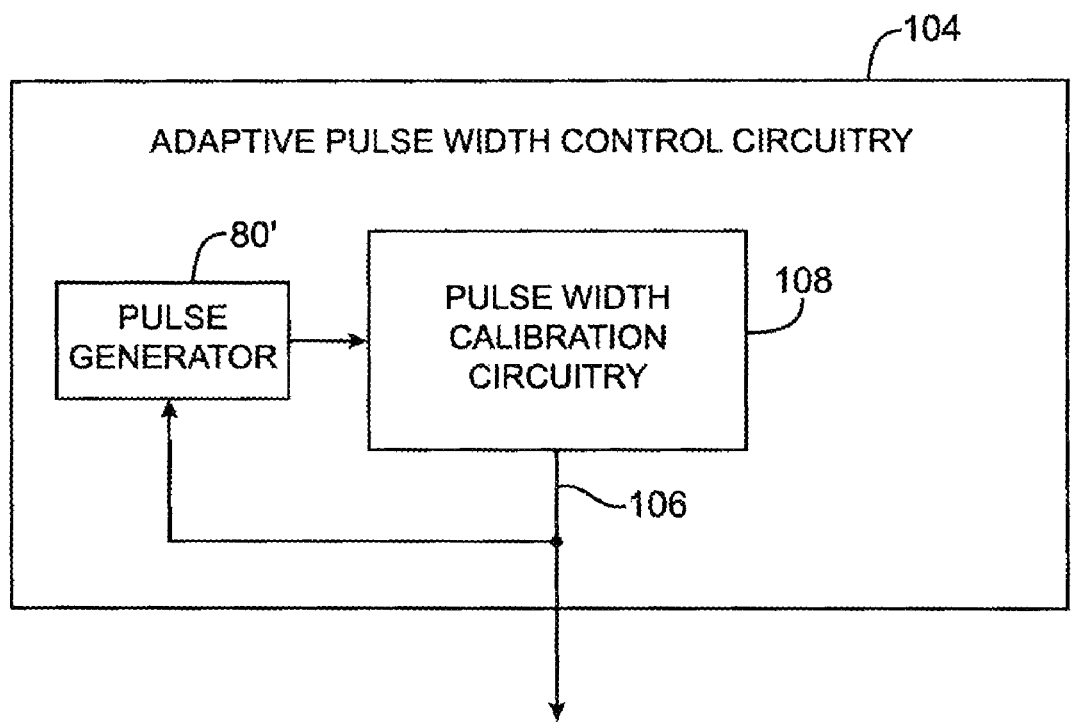
FIG. 4 is a high-level schematic diagram of illustrative adaptive pulse width control circuitry in accordance with an embodiment of the present invention.

A high-level block diagram of adaptive pulse width control circuitry 104 is shown in FIG. 4. Circuitry 104 may include a replica pulse generator such as replica pulse generator 80' and pulse width calibration circuitry such as pulse width calibration circuitry 108. Pulse generator 80' in circuitry 104 (e.g., sometimes referred to as a master pulse generator) may be a replica (or other representative version) of one of pulse generators 80 that are not part of circuitry 104. For example, pulse generator 80' may be formed using transistors of substantially similar size to the transistors of pulse generators 80 or, if desired, pulse generator 80' may be formed using transistors and interconnects having an identical layout to the transistors and interconnects of pulse generators 80 (as examples). Pulse generators 80 that are not part of circuitry 104 may sometimes be referred to as slave pulse generators. Pulse generator 80' may have an output that is connected to pulse width calibration circuitry 108. Pulse width calibration 108 may have an output that is connected to pulse control line 106 and that is connected to an input of pulse generator 80'.

Circuitry 104 may utilize feedback to generate the pulse width control signal. Pulse width calibration circuitry may receive a clock pulse signal from replica pulse generator 80' and may adaptively adjust the pulse width control signal to produce an optimum clock pulse signal with a minimized pulse width. Master pulse generator 80' may serve to model and emulate the behavior of the slave pulse generators that it controls.

Figure 5:
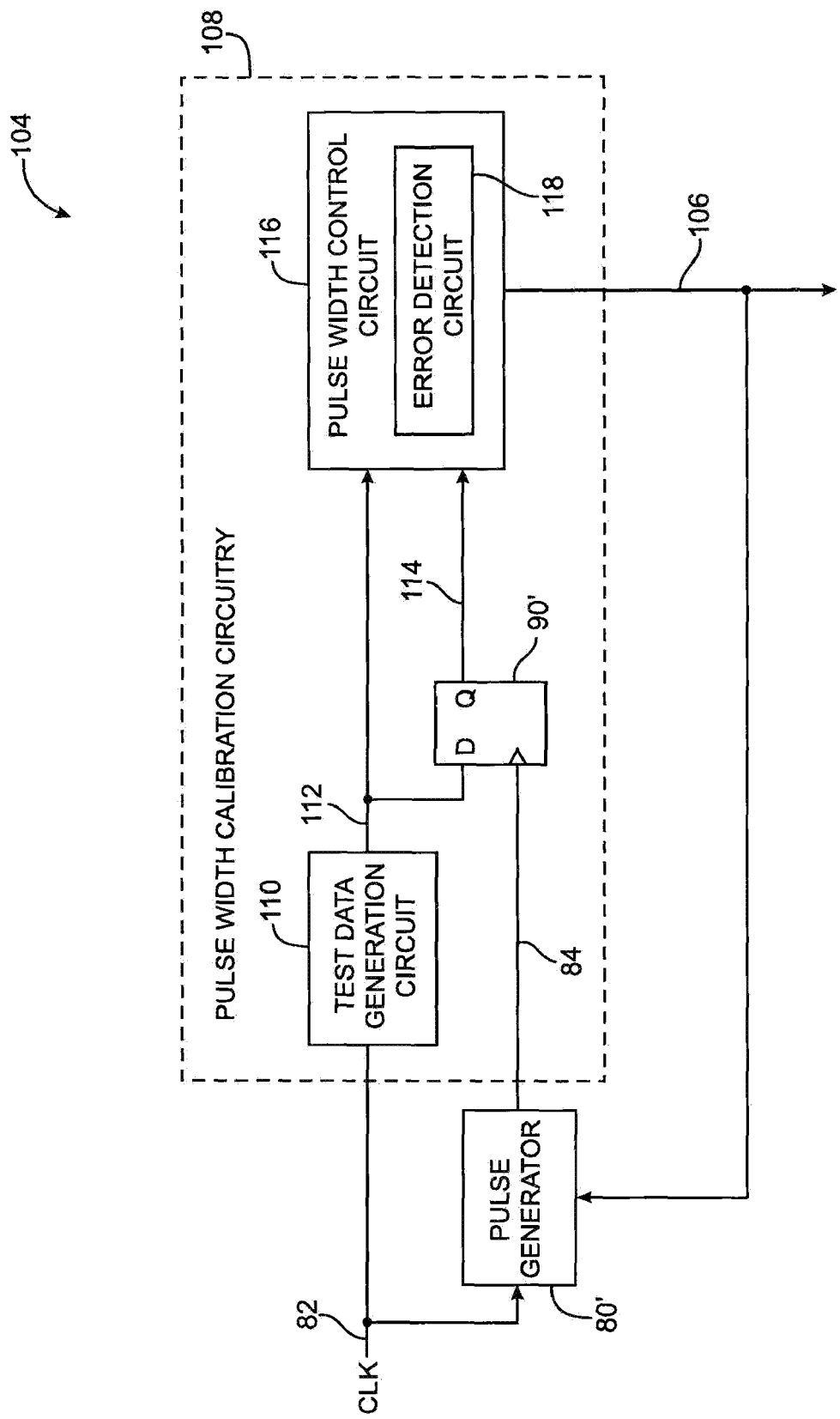
FIGS. 5 and 6 are circuit diagrams of illustrative pulse width control circuitry in accordance with an embodiment of the present invention.

As shown in FIG. 5, pulse width calibration circuitry 108 may include a test data generation circuit such as test data generation circuit 110, a test latch such as test latch 90' (e.g., a replica pulse latch), and a pulse width control circuit such as pulse width control circuit 116. Original clock signal CLK may be fed to pulse generator 80' and test data generation circuit 110. Pulse generator 80' may generate a local clock pulse signal over line 84. Line 84 may be used to control (enable) test latch 90'.

Test data generation circuit 110 may be used to generate test data over line 112. Line 112 may be connected to an input (D) of test latch 90' and may be connected to a first input of pulse width control circuit 116. Test latch 90' may attempt to latch the test data when the clock pulse signal is asserted. Test latch 90' may have an output (Q) that is connected to line 114. Test latch 90' may provide latched data over line 114. Line 114 may be connected to a second input of circuit 116.

A comparison of the test data and the latched data may be desirable to determine the minimum pulse width. For example, if the test data is not equal to the latched data, it may be desirable to increase the pulse width of the clock pulse signal to ensure that test latch 90' latches data properly. If the test data is equal to the latched data, it may be desirable to shorten the pulse width.

Pulse width control circuit 116 compares the test data (provided at its first input) to the latched data (provided at its second input). Circuit 116 may include an error detection circuit such as error detection circuit 118 that can be used to compare the test data to the latched data. For example, if the test data matches the latched data, error detection circuit 118 may output a logic "0" to indicate that test latch 90' is operating properly. If the test data fails to match the latched data, circuit 118 may output a logic "1" to indicate that test latch 90' failed to latch data properly (e.g., because pulse width is overly narrow).

The dynamic pulse width control signal conveyed over line 106 may be adjusted depending on the output of error detection circuit 118. For example, the dynamic pulse width control signal may be a three-bit digital signal. Consider a scenario in which the pulse width control signal is currently "011." If error detection circuit 118 outputs a "0," the pulse width control signal may dynamically be adjusted to "010" (e.g., decremented by one) to shorten the pulse width. If circuit 118 outputs a "1," the pulse width control signal may adaptively be changed to "100" (e.g., incremented by one) to lengthen the pulse width. The pulse width control signal may be an analog signal, if desired.

Test latch 90' may be a replica of one of the pulse latches 90. Replica test latch 90' may serve to model the behavior of the pulse latches that are used in the sequential logic circuits during normal operations.

Figure 6:
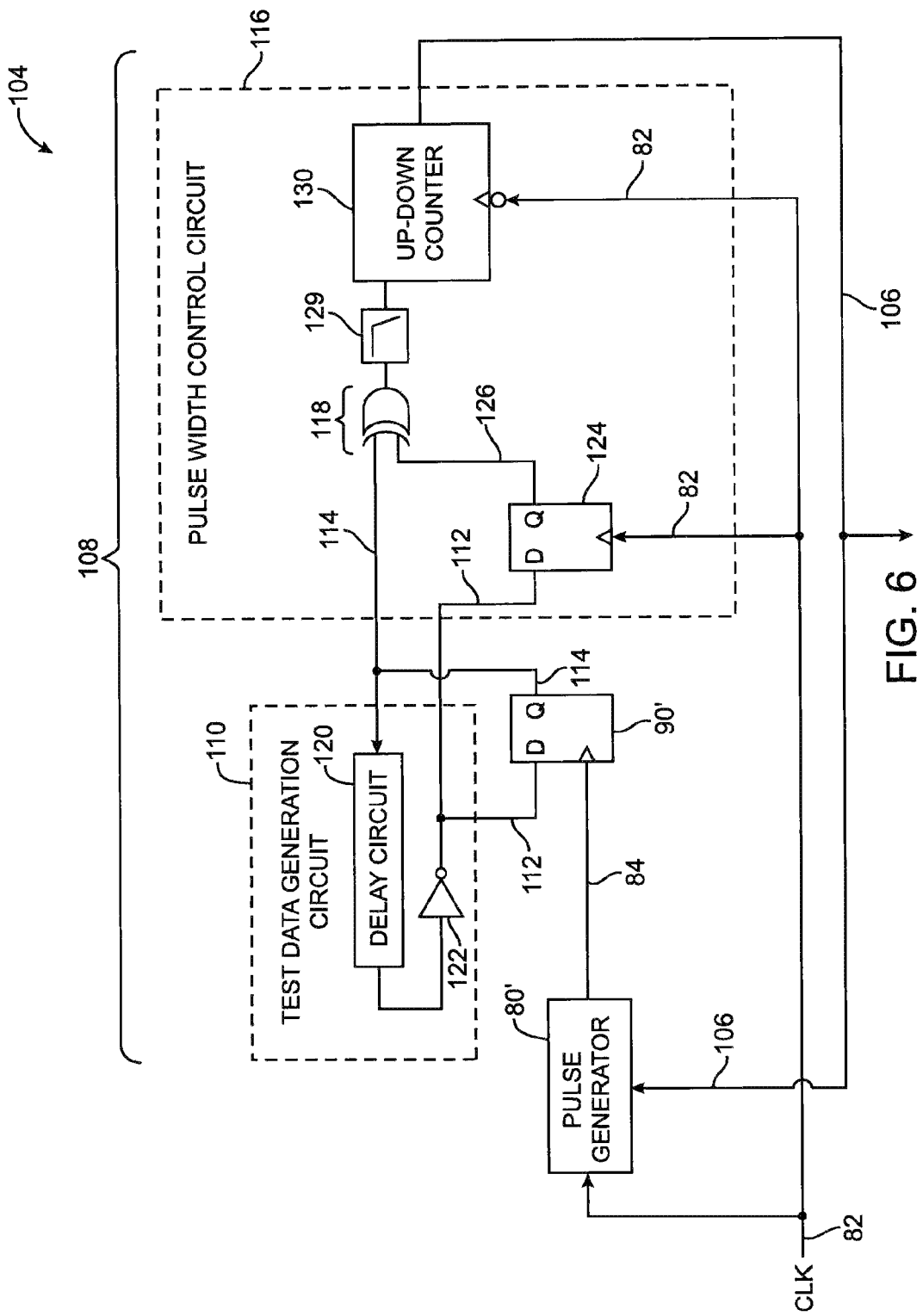

One suitable arrangement of test data generation circuit 110 and pulse width control circuit 116 is shown in FIG. 6. Test data generation circuit 110 may include a test inverter such as test inverter 122 and a delay circuit such as delay circuit 120. Circuit 110 may receive data from the output of test latch 90' over line 114. The received data may propagate through delay circuit 120. Delay circuit 120 may introduce a delay that is long enough to prevent data from racing through to cause malfunction in test latch 90'. Delay circuit 120 may include a series of delay elements such as current-starved inverters or other circuits that introduce delay. The received data may be inverted by inverter 122 and may be fed to the input of test latch 90'.

Test data generation circuit connected in this way may generate data that toggles between logic "0" and logic "1" from cycle to cycle if test latch 90' is receiving a clock pulse signal with a wide enough pulse width. In a scenario in which test latch 90' is receiving a control signal with an overly narrow pulse width, the test data generated by circuit 110 may temporarily stay constant at logic "1" or logic "0." The generated data may remain constant until the pulse width is tuned to be sufficiently wide to allow test latch 90' to properly latch data at its input.

Pulse width control circuit 116 may include an edge-triggered flip-flop (ETFF) such as ETFF 124, a logic gate such as XOR gate 118, a filter such as low-pass filter 129, and an up-down counter such as up-down counter 130. Edge-triggered flip-flop 124 may have an input (D) that is connected to line 112 and that receives test data from circuit 110. Flip-flop 124 may be controlled by original clock signal CLK. Flip-flop 124 may sample the test data at a rising clock edge of signal CLK. Flip-flop 124 may sample the test data properly as long as setup and hold times of the received data are satisfied. Sampling the test data in this way allows flip-flop 124 to provide correctly sampled data at its output (Q). The correctly sampled data may be provided over line 126.

The error detection circuit of the type described in connection with FIG. 5 may be implemented using a logic gate such as XOR gate 118. XOR gate 118 may have first and second inputs. The first input of gate 118 may be connected to line 114 and the second input of gate 118 may be connected to line 126. Gate 118 may serve as a circuit that compares the latched data (i.e., the data that is presented at its first input) with the correctly sampled data (i.e., the data that is presented at its second input). Gate 118 is capable of determining whether the data matches or differs at its inputs.

For example, consider a scenario in which the first input is at logic "1" and the second input is at logic "0." XOR gate 118 may output an error signal with logic value "1" to indicate that the data at the first and second inputs are not equal. Consider another scenario in which the first input is at logic "0" and the second input is at logic "0." XOR gate 118 may output an error signal with logic value "0" to indicate that the data at the first and second inputs match. This is merely illustrative. Other types of logic gates may be used, if desired.

Gate 118 may have an output that is connected to filter 129. Filter 29 may have an output that is connected to up-down counter 130. Filter 29 may serve to prevent high-frequency variations such as random noise or clock jitter from affecting the operation of the pulse width control circuit. The error signal may be fed over the output of gate 118. Counter 130 may be controlled by the error signal and an inverted clock signal (e.g., a signal that is an inverted version of clock signal CLK). Counter 130 may have an output that is connected to pulse control line 106 and may generate the dynamic pulse width control signal over line 106.

In another suitable arrangement, the counting circuit may be a tuning circuit that outputs an analog control signal. The value of the analog control signal may vary depending on the output of the error detection circuit. Generating an analog pulse width control signal in this way may require an additional analog-to-digital conversion at the output of the tuning circuit.

Counter 130 is negative edge-triggered, because it is controlled by the inverted clock signal. Counter 130 may therefore only adjust the pulse width control signal at falling clock edges of signal CLK. This arrangement may be desirable, because the pulse width control signal must be stable during the time immediate after the rise edges of signal CLK. Keeping the pulse width control signal stable in this way allows pulse generator 80' to generate a clock pulse signal with a predictable pulse width.

For example, counter 130 may generate a dynamic pulse width control signal (also referred to as a control count) that is four bits wide. Consider a scenario in which the pulse width control signal is currently "0101." If gate 118 outputs a "0," the pulse width control signal may dynamically be adjusted to "0100" (e.g., decremented by one) to shorten the pulse width. If gate 118 outputs a "1," the pulse width control signal may be adaptively changed to "0110" (e.g., incremented by one) to lengthen the pulse width. Counter 130 may therefore prompt the pulse width control signal to count up or count down depending on the output of the error detection circuit.

Figure 7:
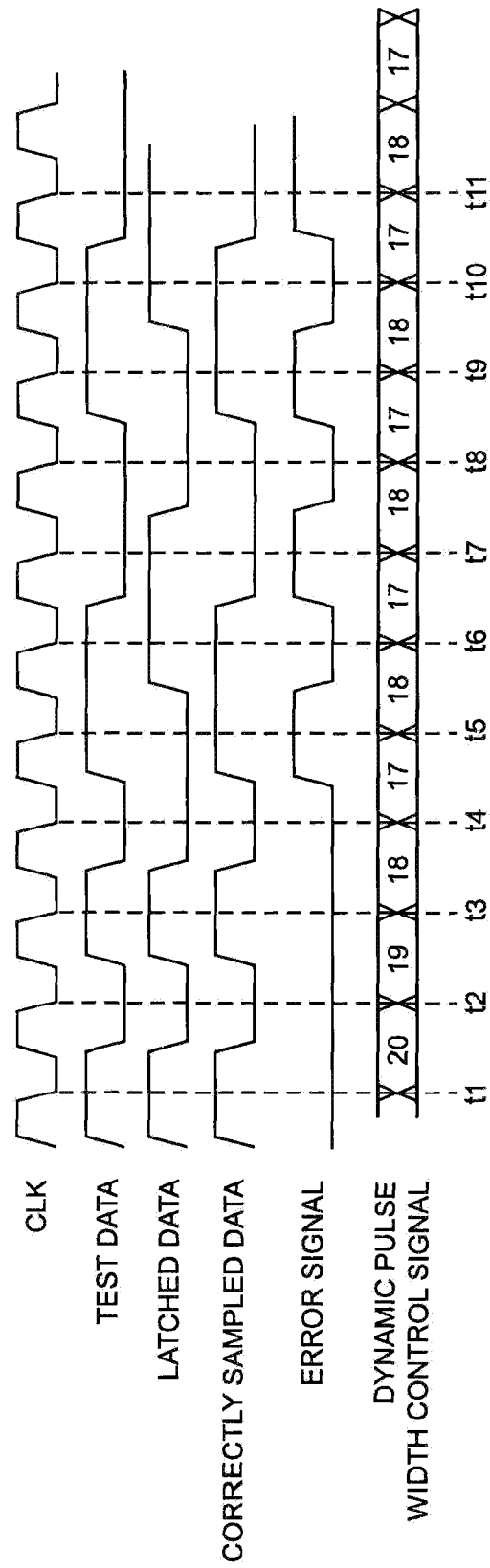
FIG. 7 is a timing diagram illustrating relevant signals during operation of pulse width control circuitry of the type described in connection with FIGS. 5 and 6 in accordance with an embodiment of the present invention.

FIG. 7 shows a timing diagram illustrating the behavior of relevant signals during operation of adaptive pulse width control circuitry 104. Signal CLK may be provided over clock line 82. The test data may be provided over line 112 (e.g., the output of test data generation circuit 110). The latched data may be provided over line 114 (e.g., the output of test latch 90'). The correctly sampled data may be provided over line 126 (e.g., the output of flip-flip 124). The correctly sampled data may track the test data. The error signal may be provided at the output of error detection circuit 118 (e.g., XOR gate 118). The dynamic pulse width control signal may be provided over pulse control line 106 (e.g., the output of counter 130).

The test data, the latched data, the correctly sampled data, and the error signal may change values at the rising edges of signal CLK. The dynamic pulse width control signal may change values at the falling edges of signal CLK (e.g., at times t1, t2, t3, etc.), because counter 130 is controlled by the inverted clock signal. The pulse width control signal may be a digital signal with any number of bits.

The error signal will have a logic value of "0" if the latched data is equal to the correctly sampled data (e.g., at times t1-t4). An error signal with a logic value of "0" indicates that replica test latch 90' is receiving a clock pulse signal with sufficient pulse width. This error signal may then control counter 130 to lower the control count. For example, the control count may have a digital value of 20 at time t1. The control count may be decreased to 19, 18, and 17 at times t2, t3, and t4, respectively, because the error signal has a logic value of "0" during those times.

At time t5, the latched data fails to match the correctly sampled data. This discrepancy is indicated by the error signal having a logic "1." An error signal with a logic value of "1"

indicates that replica test latch 90' is receiving a clock pulse signal with an overly narrow pulse width and that test latch 90' cannot latch data properly if given the overly narrow pulse width. This error signal may then control counter 130 to increase the value of the control count. For example, the control count may be increased back up to 18 at time t5. The test data may remain at its previous value if the latched data fails to match the correctly sampled data (e.g., test data stayed high at time t5 and t6).

During the next clock cycle, the latched data may again match the correctly sampled data (at time t6) and may cause the error signal to lower to logic "0." The error signal may toggle between logic "0" and "1" in this way when the dynamic pulse width control signal is controlling master pulse generator 80' to output a clock pulse signal with a minimum required pulse width.

The pulse width control signal may be broadcast to slave pulse generators 80 on integrated circuit 10. It may be desirable for the slave pulse generators 80 to generate clock pulse signals with a pulse width that is wider than the minimum required pulse width to have adequate margin to tolerate for variations in process, voltage, and temperature (PVT). For example, the slave pulse generators may generate a pulse width that is 20% wider than the minimum pulse width generated by the master pulse generator. As described in connection with FIG. 7, if circuitry 104 generates a 200 ps pulse width for a control count of 18, then the slave pulse generators may be configured to generate a 240 ps pulse width. The additional 40 ps represents margin that is provided to accommodate for on-die PVT variations. It may be desirable to minimize this margin at the cost of decreased tolerance to variability.

One suitable arrangement of implementing this margin may be to form relatively weaker delay circuits in the slave pulse generators and to directly broadcast the output of calibration circuitry 108. For example, the weaker delay circuits may include inverters that are designed to produce 20% more delay than the inverters used in the master pulse generator.

Another suitable arrangement of implementing the margin is to broadcast a padded (boosted) pulse width control signal (also referred to as a padded control count) that has a greater value than the nominal control count (e.g., the immediate output value of circuitry 104). For example, if the nominal control count has a count of n, the padded control count may have a count of n+4. In the scenario shown in FIG. 7, the padded control count that may be broadcast to the slave pulse generators would toggle between count 21 and 22 (17 and 18 incremented by 4) during times t5-t11 (as an example). Increasing the value of the nominal control count (e.g., the nominal pulse width control signal) in this way may provide sufficient margin to tolerate for variation in PVT. In this arrangement, the master pulse generator and the slave pulse generators may be identical (e.g., weaker delay circuits are not necessary). If desired, the pulse width control signal may be incremented by any amount to provide the desired margin. This technique may be combined with the approach that uses relatively weaker delay circuits in the slave pulse generates, if desired.

Figure 8:
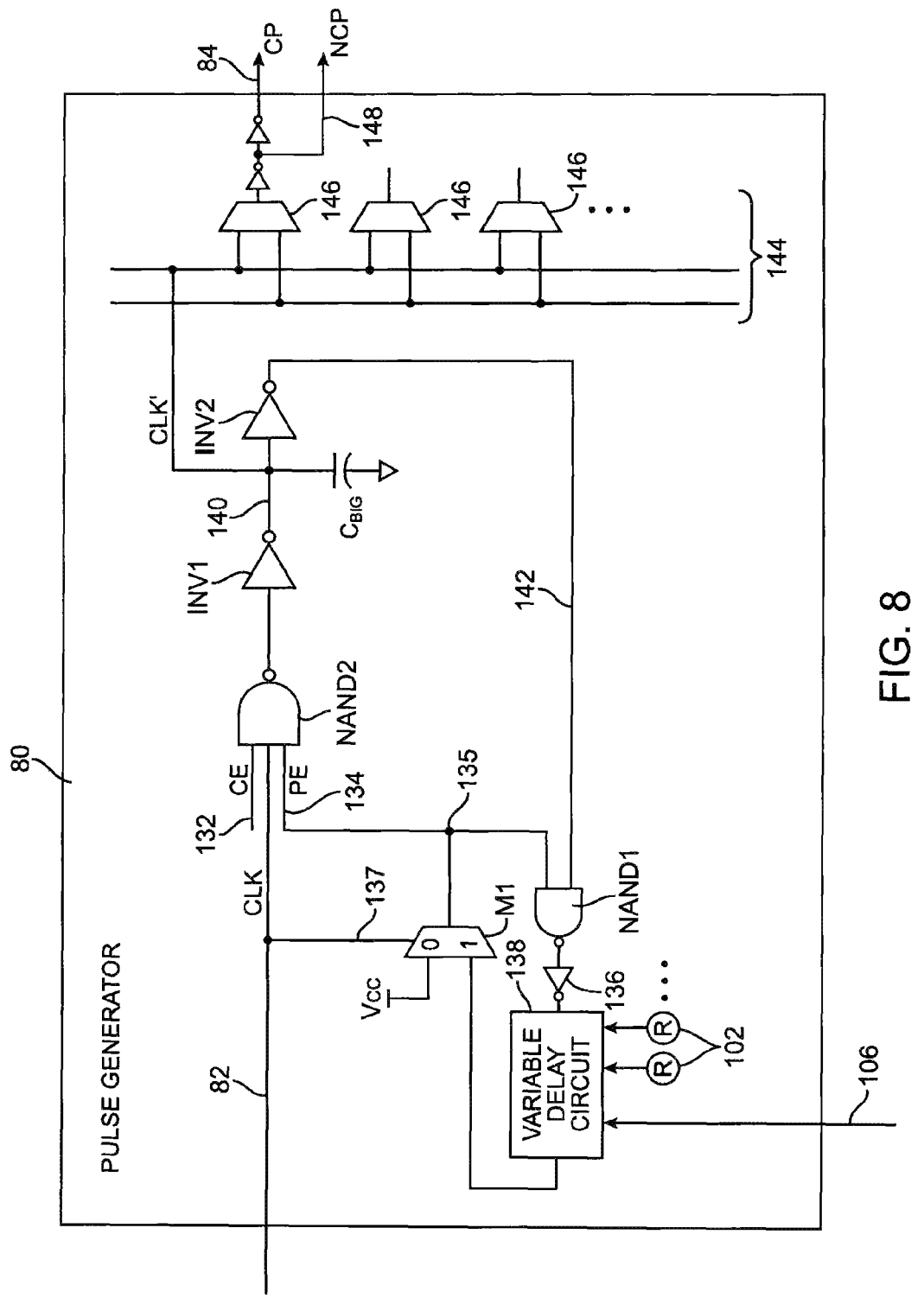
FIG. 8 is a circuit diagram of an illustrative pulse generator in accordance with an embodiment of the present invention.

The details of slave pulse generator 80 are shown in FIG. 8. Pulse generator 80 may include logic gates such as NAND gates NAND1 and NAND2, a multiplexer such as multiplexer M1, inverters INV1, INV2, and 136, variable delay circuit 138, and logic circuitry 144.

Clock signal CLK may be conveyed over line 82 to an input of gate NAND2. Gate NAND2 may also receive a clock enable signal CE and a pulse enable signal PE on respective inputs 132 and 134. Gate NAND2 may have an output that is connected to an input of inverter INV1. Inverter INV1 produces a clock pulse signal CLK' on path 140. As shown schematically by parasitic capacitance $C_{BIG}$, there may be a non-negligible amount of parasitic capacitance associated with driving path 140, as it may be used to drive many logic elements and flip-flops, only three of which are shown. As a result, inverter INV1 may be constructed using large transistors, as illustrated schematically in FIG. 8 by the relatively large size of inverter INV1.

The clock pulse signal CLK' may be provided to the input of logic circuitry 144. Circuitry 144 may include optional multiplexer circuitry (e.g., multiplexers 146) for allowing logic elements to select a desired signal CLK' to use as its clock pulse signal CP or, following inversion, as its inverted clock pulse signal NCP. There may be, for example, two or more possible signals CLK' in a given region of logic from which to choose (e.g., in multiclock architectures). Circuitry 144 may include inverter circuitry to use in producing inverted clock pulse signals. As shown in FIG. 8, clock pulse signals CP and NCP may be provided at respective outputs 84 and 148 of logic 144.

The clock pulse signal CLK' may be provided to the input of inverter INV2. Output signals from inverter INV2 may be routed to one of the two inputs of gate NAND1. The other input of gate NAND1 may receive signal PE from node 135. A configurable amount of delay may be provided using a variable delay circuit such as variable delay circuit 138. Gate NAND1 may be coupled to variable delay circuit 138 through inverter 136. Variable delay circuit 138 may be controlled by the pulse width control signal provided over line 106 and by programmable bits stored in associated memory cells 102.

Multiplexer M1 receives the output of variable delay circuit 138 at its "1" input and receives positive power supply voltage Vcc at its "0" input. The output of multiplexer M1 is provided to node 135. Multiplexer M1 has a control input 137 that determines its state. Control input 137 is connected to line 82 and receives clock signal CLK. When clock CLK is high, the output of variable delay circuit 138 is routed to node 135. When clock CLK is low, multiplexer M1 is configured to route the high voltage on its "0" input to node 135.

The operation of pulse generator 80 may be understood as follows. Initially, clock signal CLK is low, so multiplexer M1 routes the high voltage on its "0" input to node 135. This takes signal PE high. Clock enable signal CE is initially high. Because CLK is low, the output of gate NAND2 is high. With the output of gate NAND2 high, the output of inverter INV1 (i.e., signal CLK') is low (as is associated signal CP). With signal CLK' low, the output of inverter INV2 is high. Because signal PE is high and the output of inverter INV2 is high, both inputs to gate NAND1 are high. As a result, the output of gate NAND1 is low. Inverter 136 inverts the low output from gate NAND1 and produces a high signal at its output. Because clock CLK is low, the control input to multiplexer M1 on line 137 is low and multiplexer M1 connects the high signal on its "0" input to node 135, maintaining signal PE at its high value.

When clock signal CLK transitions from low to high, the control input to multiplexer M1 on line 137 goes high. As a result, multiplexer M1 switches to its "1" input and passes the high input from the output of inverter 136 at M1's "1" input to its output. There is thus no immediate change in the state of signal PE.

At this stage, clock enable signal CE is high and signal PE is high. Accordingly, the output of gate NAND2 goes low when clock signal CLK goes high. Inverter INV1 inverts the low signal at the output of NAND2 and produces a high signal CLK'. Inverter INV2 inverts this high signal, so that the output of inverter INV2 goes low. Gate NAND1 has a high input from signal PE. When gate NAND1 receives the low signal from inverter INV2, the output of gate NAND1 goes high. Inverter 136 receives the high output from NAND gate NAND1 and takes its output low. Clock signal CLK is high, so multiplexer M1 is configured to route the low signal on its "1" input to node 135. This takes signal PE low.

As a result of the operation of the pulse generator, a signal PE is generated that is an inverted and delayed version of signal CLK and a pulse-shaped signal CLK' is generated on path 140. Signal CLK' goes high (after a short delay) whenever clock signal CLK has a rising edge and goes low (after a short delay) shortly after the rising edge of CLK, with a delay determined by the amount of time required for signal CLK' to rise together with any additional delay from variable delay circuit 138. Signal CLK' (and signals CP and NCP which are true and complementary versions of signals CLK') therefore may be characterized by a pulse shape with pulse width Tpw of the type shown in FIG. 2.

Logic circuitry 144 may include multiple multiplexers such as multiplexers 146. There may be more than three multiplexers 146. Multiplexers 146 may be used to select the desired signal CLK'. Multiplexers 146 may have input terminals that are connected to path 140. The input terminals may present capacitive loading on path 140 and may contribute to parasitic capacitance $C_{BIG}$.

The configuration of master pulse generator 80' that is used in circuitry 104 is similar to the configuration of slave pulse generator 80 of FIG. 8. The master pulse generator may receive a nominal pulse width control count over line 106 while the slave pulse generator receives the padded control count. The padded control count may have a greater value than the nominal control count to provide margin to counteract PVT variations.

The master pulse generator may include dummy multiplexers 146 in logic circuitry 144. Dummy multiplexers 146 may serve to replicate capacitive loading behaviours in the slave pulse generators. Dummy multiplexers 146 may have outputs that are not connected to other logic gates (e.g., multiplexers 146 has floating outputs). Input 132 of the master pulse generator may be connected to a positive power supply line that is driven to voltage Vcc.

Variable delay circuit 138 may be controlled by storage elements such as RAM cells 102 and may be controlled by the control signal that is conveyed over line 106. RAM cells 102 may store configuration bits that specify an intended nominal pulse width with no knowledge of the silicon characteristics of integrated circuit 10. For example, the configuration bits may be determined using simulation tools prior to actual fabrication of integrated circuit 10.

In addition to the configuration bits, the control signal (e.g., nominal control count or padded control count) provided over line 106 may serve as a post-silicon adjustment knob. The control signal may be provided dynamically from adaptive pulse width control circuitry 104 of FIGS. 4, 5, and 6. The control signal provided in this way may be able to adaptively compensate for any PVT variation in real time to allow circuitry 104 to generate a clock pulse signal with a minimized pulse width that still enables latches 90 to latch data properly during operation of integrated circuit 10. If desired, the control signal may also be assigned statically by providing information about the silicon characters of the die over line 106. Statically setting variable delay 138 in this way may compensate for any type of manufacturing (process) variation.

Figure 9:
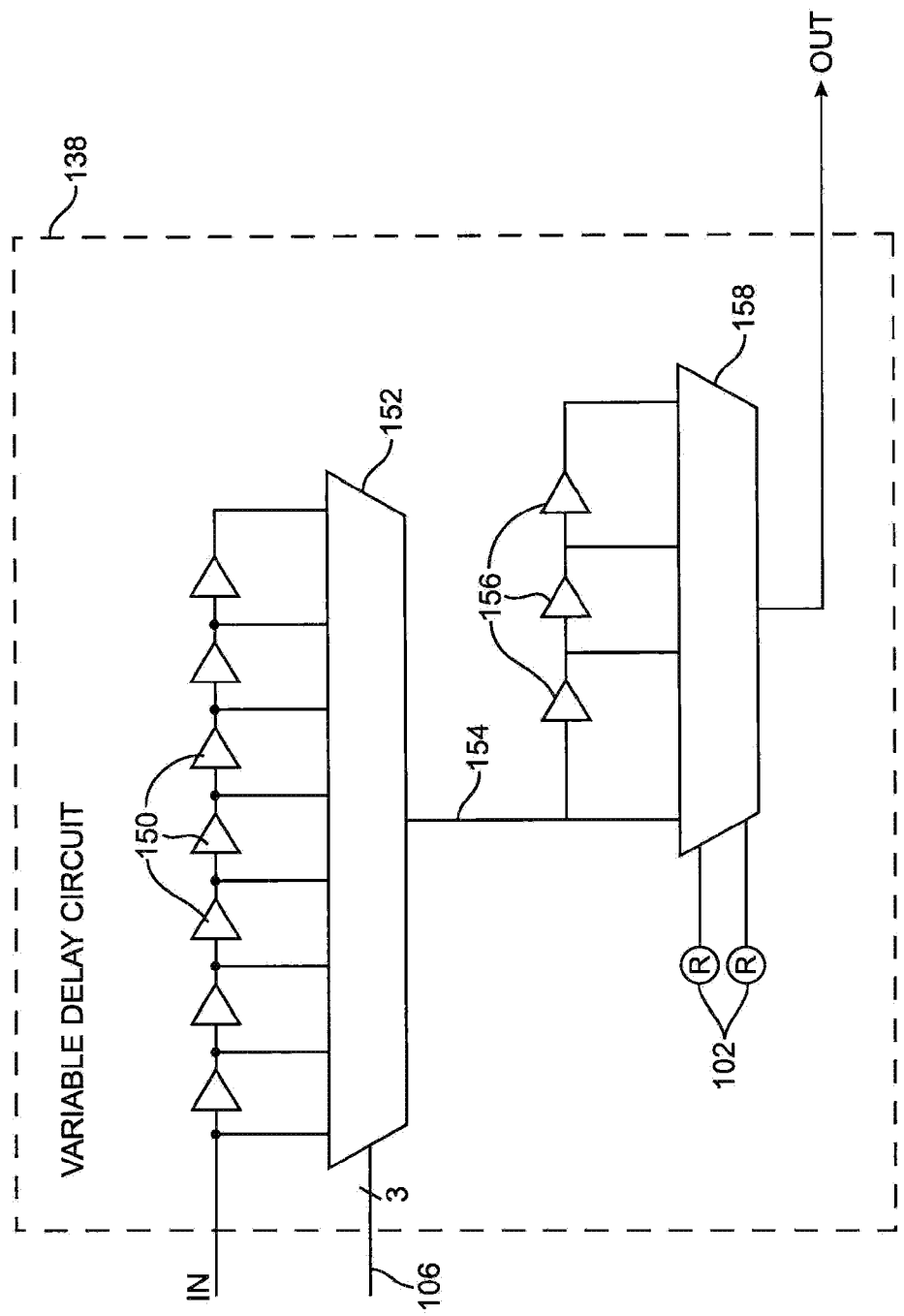
FIGS. 9 and 10 are circuit diagrams of illustrative variable delay circuits in accordance with an embodiment of the present invention.

One suitable arrangement of variable delay circuit 138 is shown in FIG. 9. Variable delay circuit 138 may have an input terminal IN and an output terminal OUT. Input terminal IN may be connected to a first buffer chain that includes buffers 150. Each buffer 150 may include two series-connected inverters. For example, input terminal IN may be connected to a chain of seven buffers. Any number of buffers may be used, if desired. Buffers 150 may each have an output that is connected to a respective input of a multiplexer such as multiplexer 152. Input IN may also be connected to a given input of multiplexer 152.

Multiplexer 152 may be controlled by the control signal (e.g., the dynamic pulse width control signal) that is provided over line 106. In this example, the control signal may be a three-bit signal. The control signal may be used to select a desired delay path from one of the inputs of multiplexer 152. Each buffer may provide a delay of 25 ps (as an example). If desired, the control signal may select a first delay path (e.g., a path that bypasses the first buffer chain entirely) to provide a first delay that is equal to an intrinsic delay of 10 ps (e.g., delay through multiplexer 152). The control signal may select a second delay path (e.g., a path that includes the delay of the first buffer) to provide a first delay of 35 ps (10 ps intrinsic delay plus 25 ps delay from the first buffer). The control signal may select a third delay path (e.g., a path that includes the delay of the first and second buffers) to provide a first delay of 60 ps (10 ps intrinsic delay plus 50 ps delay from the first buffer and second buffers). The control signal can select eight different delay paths that can provide eight different amounts of delay in this way.

This is merely illustrative. The control signal may be any number of bits and may be used to control any number of buffers to provide the desired first delay. The control signal need not be a binary-coded signal. If desired, the control signal may be a thermometer-coded signal to prevent undesirable glitches in the control signal.

Multiplexer 152 may have output 154. A signal traveling from input IN to output 154 may experience the first delay. Output 154 may be connected to a second buffer chain that includes three buffers 156. Each buffer 156 may include two series-connected inverters. Buffers 156 in the second buffer chain may provide a different amount of delay in comparison to buffers 150 in the first buffer chain, if desired. Output 154 may be connected to a chain of three buffers (as an example). Any number of buffers may be used in the second buffer chain. Buffers 156 may each have an output that is connected to a respective input of a multiplexer such as multiplexer 158. Output 154 may also be connected to a given input of multiplexer 158.

Multiplexer 158 may be controlled by the configuration bits that are stored in cells 102. In this example, two configuration bits are provided by two RAM cells. The configuration bits may be used to select a desired delay path from one of the inputs of multiplexer 158. Each buffer 156 may provide a delay of 50 ps (as an example). The configuration bits may select a first delay path (e.g., a path that bypasses the second buffer chain entirely) to provide a second delay that is equal to an intrinsic delay of 5 ps (e.g., delay through multiplexer 158). The configuration bits may select a second delay path (e.g., a path that includes the delay of a first buffer 156) to provide a first delay of 55 ps (5 ps intrinsic delay plus 50 ps delay from the first buffer). The configuration bits may select a third delay path (e.g., a path that includes the combined delay of the first and second buffers) to provide a first delay of 105 ps (5 ps intrinsic delay plus 100 ps delay from the first buffer and second buffers). The configuration bits can select four different delay paths in this way.

This is merely illustrative. The any number of configuration bits may be used to control any number of buffers to provide a desired second delay.

Multiplexer 158 may have an output that is connected to output terminal OUT. A signal traveling from output 154 to output terminal OUT may experience the second delay. The first and second delay may be combined to provide a total delay. The total delay may represent the cumulative delay that a signal experiences when it travels from input terminal IN to output terminal OUT of variable delay circuitry 138. In summary, variable delay circuit 138 may be adjusted to provide a desired amount of total delay depending on the value of the dynamic pulse width control signal (e.g., control count provided over line 106) and the setting of the configuration bits.

Figure 10:
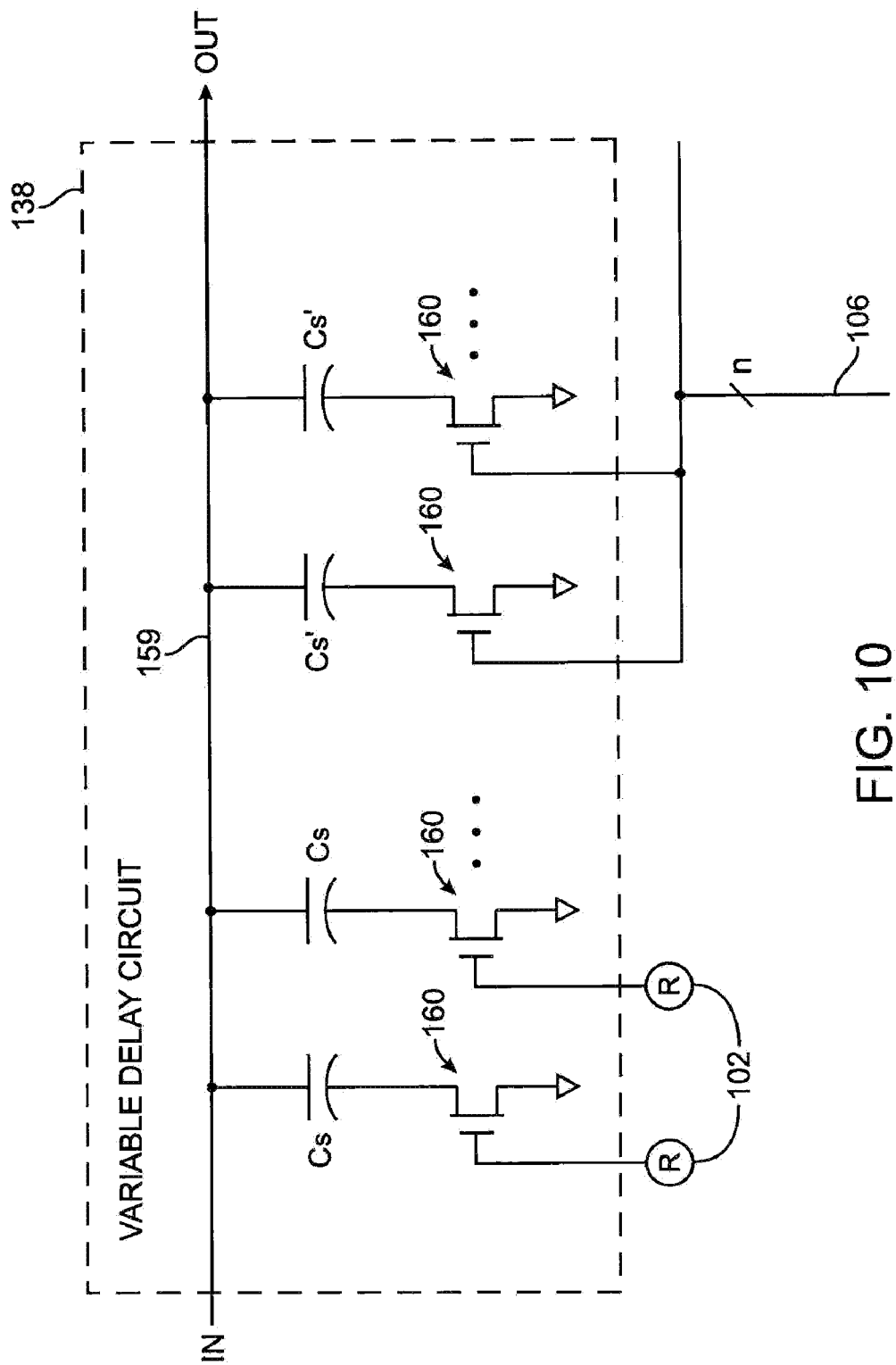

FIG. 10 shows another suitable arrangement of variable delay circuit 138. Variable delay circuit 138 may have input and output terminals such as terminals IN and OUT, respectively. Line 159 may connect terminal IN to terminal OUT. Shunt capacitors (e.g., capacitors connected in parallel) such as capacitors Cs and Cs' may be connected to line 159. Each shunt capacitor (i.e., capacitors Cs and Cs') may be coupled between line 159 and a ground line that is driven to zero volts. Each shunt capacitor may be connected in series with a transistor such as transistor 160. Transistor 160 may be an n-channel metal-oxide-semiconductor (NMOS) device. Transistors 160 associated with capacitors Cs may be controlled by the configuration bits stored in cells 102. Transistors 160 associated with capacitors Cs' may be controlled by the control signal provided over line 106. If desired, any number of configuration bits and a control signal with any number of bits may be used to switch capacitors Cs and Cs' into use to vary the total delay provided by variable delay circuit.

For example, a portion of cells 102 may store a logic "1" to enable corresponding capacitors Cs to provide a first capacitive load. A portion of capacitors Cs' may be enabled depending on the current configuration of the dynamic control signal conveyed over line 106 to provide a second capacitive load. The first and second capacitive load may present a total capacitive load on line 159 to provide the desired total delay from terminal IN to terminal OUT.

These examples are merely illustrative. The variable delay circuit may be implemented using configurable inverter chains, current-starved inverter chains (e.g., inverters having transistors that are controlled by adjustable analog voltages), shunt capacitor delay elements, or other circuits that produce variable delay.

Figure 11:
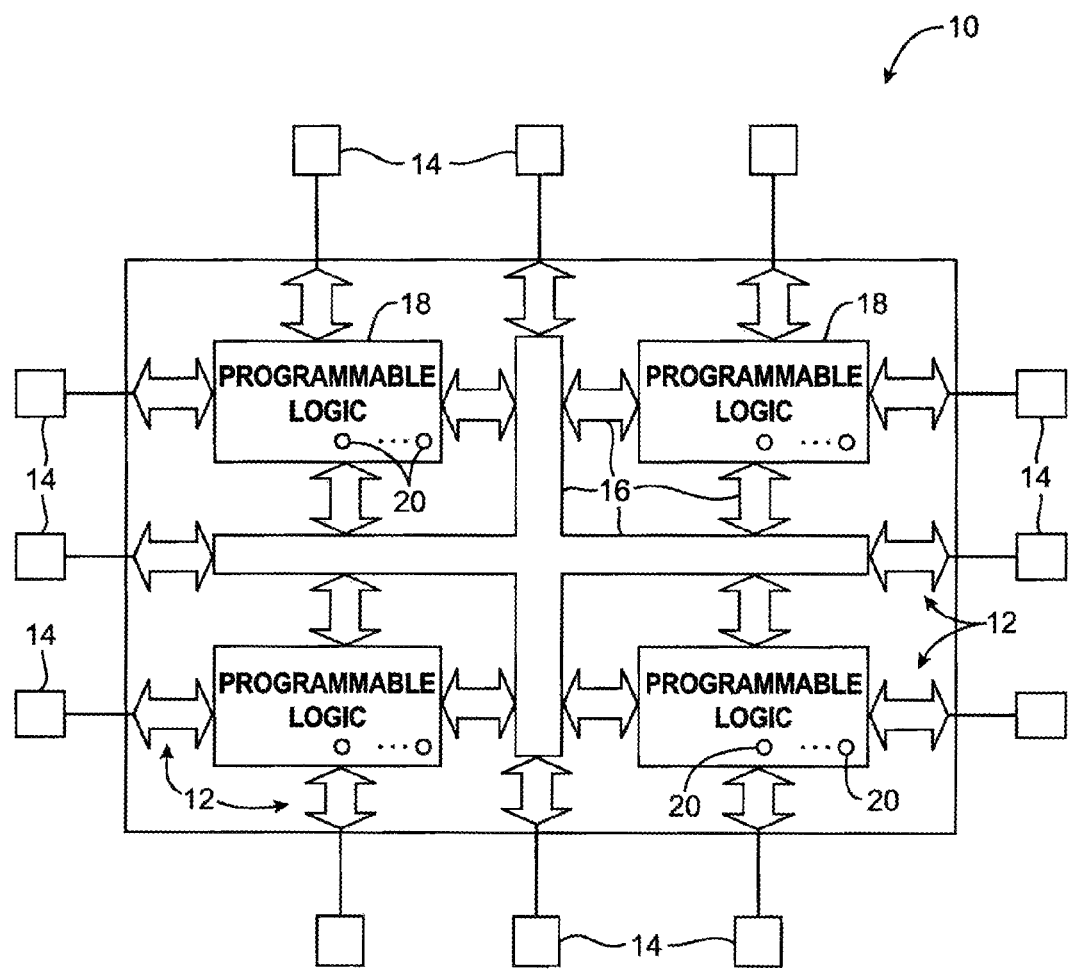
FIG. 11 is a diagram of an illustrative programmable logic device in accordance with the present invention.

Adaptive pulse width control circuitry 104 may sometimes be used on a programmable integrated circuit such as a programmable logic device integrated circuit. An illustrative programmable logic device 10 is shown in FIG. 11. Programmable logic device 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable logic device 10 contains volatile memory elements 20 that can be loaded with configuration data (also called programming data) using pins 14 and input-output circuitry 12. Once loaded, the memory elements each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers and logic array blocks (LABS).

Figure 12:
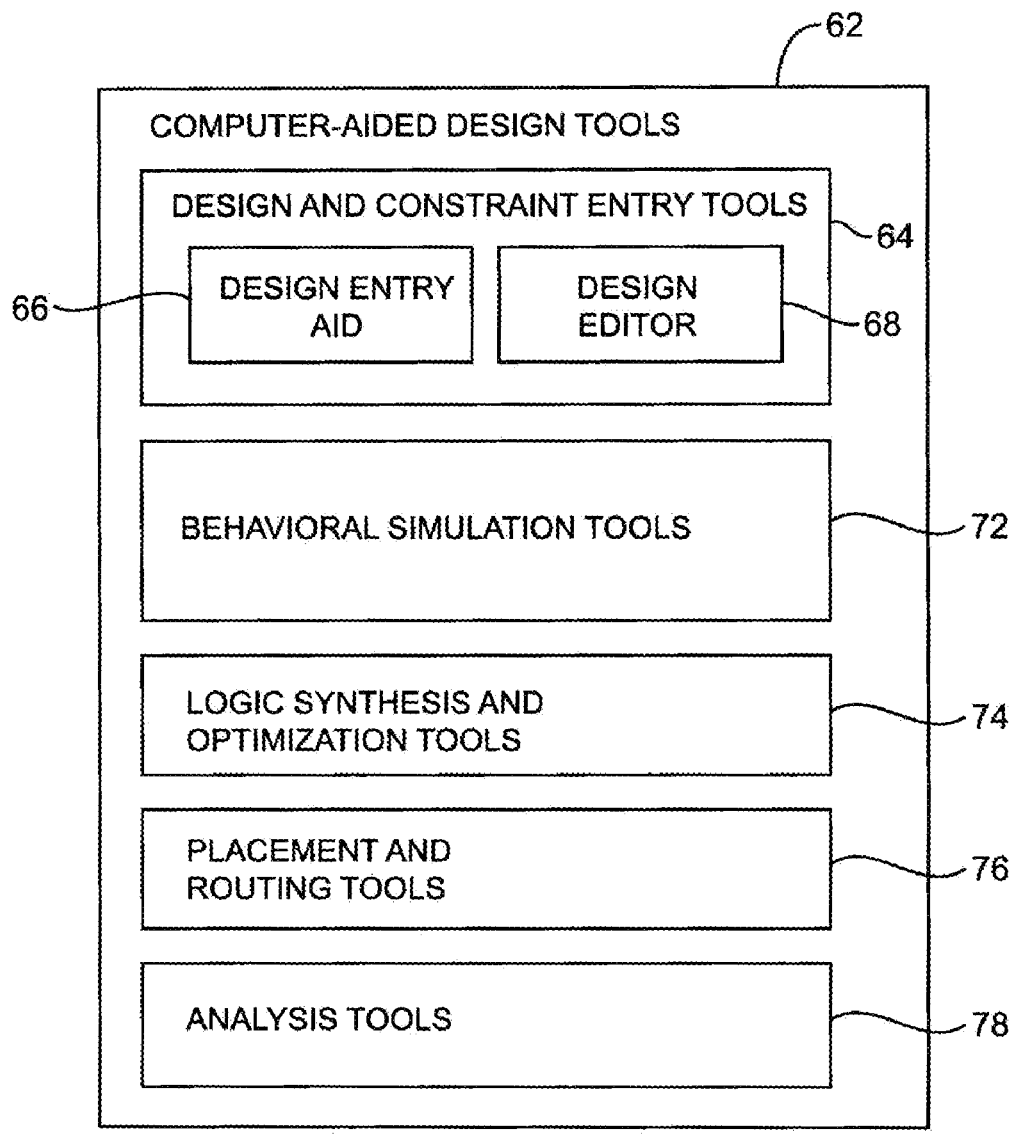
FIG. 12 is a flow chart of illustrative steps involved in designing a custom logic circuit and producing configuration data for that circuit in accordance with the present invention.

As described previously in connection with FIG. 8, the configuration bits may be determined using simulation tools such as computer aided design (CAD) tool 62. CAD tool 62 may be used to determine the configuration bit settings (e.g., determined prior to actual fabrication) that are used to control circuitry 104. This predictive setting may not be used to counteract manufacture-induced variations. Illustrative computer aided design tools 62 that may be used in a logic design system are shown in FIG. 12.

The design process typically starts with the formulation of logic circuit functional specifications. A logic designer can specify how a desired circuit should function using design and constraint entry tools 64. Design and constraint entry tools 64 may include tools such as design and constraint entry aid 66 and design editor 68. Design and constraint entry aids such as aid 66 may be used to help a logic designer locate a desired design from a library of existing logic designs and may provide computer-aided assistance to the logic designer for entering (specifying) the desired design. As an example, design and constraint entry aid 66 may be used to present screens of options for a user. The user may click on on-screen options to select whether the circuit being designed should have certain features. Design editor 68 may be used to enter a design (e.g., by entering lines of hardware description language code), may be used to edit a design obtained from a library (e.g., using a design and constraint entry aid), or may assist a user in selecting and editing appropriate prepackaged code/designs.

After the design has been entered using design and constraint entry tools 64, behavioral simulation tools 72 may be used to simulate the functional performance of the design. If the functional performance of the design is incomplete or incorrect, the logic designer can make changes to the design using design and constraint entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.).

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family).

Tools 74 attempt to optimize the design by making appropriate selections of hardware to implement different logic functions in the logic design based on the logic design data and constraint data entered by the logic designer using tools 64.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

Tools such as tools 74 and 76 may be part of a compiler suite (e.g., part of a suite of compiler tools provided by a programmable logic device vendor). In accordance with the present invention, tools such as tools 74 and 76 manually and automatically take into account the effects of using different configuration random-access-memory cell power supply levels in different regions of a device while implementing a desired circuit design. This allows tools 74 and 76 to minimize power consumption (e.g., power consumption due to pass transistor leakage currents) while satisfying design constraints.

After an implementation of the desired logic design in the programmable logic device has been generated using placement and routing tools 76, the implementation of the design may be analyzed and tested using analysis tools 78. After satisfactory optimization operations have been completed using tools 62, tools 62 can produce the configuration data for the programmable logic device.

Tools 62 of FIG. 12 may be used to produce configuration data files. An initial netlist may be synthesized to produce a post-synthesis netlist. User input and the post synthesis netlist are processed during place and route and optimization operations. During place and route operations, the CAD tools 62 take account of the effects of using different configuration random-access-memory cell power supply levels in different portions of the device and, through appropriate selection of memory cell power supply levels, circuit resource assignments, and placement decisions, tools 62 reduce power consumption while satisfying design constraints. The resulting netlist is processed further during an assembly process to produce a configuration data file output (e.g., a .pof or .sof file). This data file output may be used to determine the desired configuration bit settings to store in RAM cells 102 in circuitry 104.

The foregoing is merely illustrative of the principles of this invention and various modifications can be made by those skilled in the art without departing from the scope and spirit of the invention.

What is claimed is:

1. Adaptive clock pulse width control circuitry, comprising:
    a pulse latch clock pulse generator having an output at which a pulse latch clock pulse signal is provided that has an adjustable pulse width; and
    clock pulse width calibration circuitry that receives the pulse latch clock pulse signal from the output of the pulse latch clock pulse generator, wherein the clock pulse width calibration circuitry generates a clock pulse width control signal that controls the pulse latch clock pulse generator to adjust the pulse width.

2. The adaptive clock pulse width control circuitry defined in claim 1, wherein the clock pulse width calibration circuitry comprises:
    a test data generation circuit operable to generate test data;
    a test latch having a data input operable to receive the test data, a control input operable to receive the pulse latch clock pulse signal, and a data output operable to provide latched data; and
    a clock pulse width control circuit having a first input operable to receive the test data, a second input operable to receive the latched data, and a control output operable to provide the clock pulse width control signal.

3. The adaptive clock pulse width control circuitry defined in claim 2, wherein the pulse latch clock pulse generator has a clock input operable to receive a square wave clock signal that is used to generate the pulse latch clock pulse signal.

4. The adaptive clock pulse width control circuitry defined in claim 2, wherein the test data generation circuit comprises a delay circuit coupled to an inverter.

5. The adaptive clock pulse width control circuitry defined in claim 2, wherein the clock pulse width control circuit comprises:
    an edge-triggered flip-flop operable to be clocked by a square wave clock signal, to receive the test data, and to output correctly sampled data;
    an error detection circuit having a first input operable to receive the latched data, a second input operable to receive the correctly sampled data, and an error output on which the error detection circuit provides an error signal in response to the received test data and the correctly sampled data; and
    an up-down counter operable to receive the error signal and operable to dynamically adjust the clock pulse width control signal based on the error signal.

6. The adaptive clock pulse width control circuitry defined in claim 5, wherein the error detection circuit comprises an exclusive OR gate.

7. The adaptive clock pulse width control circuitry defined in claim 3, wherein the clock pulse width control circuit comprises:
    a positive edge-triggered flip-flop operable to be clocked by the square wave clock signal, to receive the test data, and to output correctly sampled data;
    an error detection circuit having a first input operable to receive the latched data, a second input operable to receive the correctly sampled data, and an error output operable to provide an error signal; and
    a negative edge-triggered up-down counter operable to be clocked by an inverted square wave clock signal, to receive the error signal, and to dynamically adjust the clock pulse width control signal based on the error signal.

8. The adaptive clock pulse width control circuitry defined in claim 7, wherein the error detection circuit comprises an exclusive OR gate.

9. An integrated circuit, comprising:
    groups of pulse latches;
    adaptive pulse width control circuitry operable to generate a pulse width control signal, wherein the adaptive pulse width control circuitry includes a master clock pulse generator having a control input operable to receive the pulse width control signal; and
    a plurality of clock pulse generators, wherein each clock pulse generator in the plurality of clock pulse generators is operable to be controlled by the pulse width control signal and is operable to generate a respective clock pulse signal that has an adjustable pulse width and that controls the pulse latches in a respective one of the groups of pulse latches.

10. The integrated circuit defined in claim 9, further comprising memory cells operable to supply static control signals to the plurality of clock pulse generators.

11. The integrated circuit defined in claim 10, wherein the adaptive pulse width control circuitry further includes clock pulse width calibration circuitry, wherein the master clock pulse generator is operable to provide a local clock pulse signal with a pulse width to the clock pulse width calibration circuitry, wherein the master clock pulse generator has a clock input operable to receive a square wave clock signal that is used to generate the local clock pulse signal, wherein the pulse width calibration circuitry is operable to generate the pulse width control signal, and wherein the pulse width control signal is operable to dynamically adjust the pulse width of the local clock pulse signal and to dynamically adjust the pulse width of the clock pulse signals generated by the plurality of clock pulse generators.

12. The integrated circuit defined in claim 11, wherein the clock pulse width calibration circuitry comprises:
   a test data generation circuit operable to generate test data;
   a test latch having a data input operable to receive the test data, a control input operable to receive the local clock pulse signal, and a data output operable to provide latched data; and
   a clock pulse width control circuit having a first input operable to receive the test data, a second input operable to receive the latched data from the data output of the test latch, and a control output operable to provide the pulse width control signal.

13. The integrated circuit defined in claim 12, wherein the test data generation circuit comprises a delay circuit coupled to a test inverter.

14. The integrated circuit defined in claim 12, wherein the clock pulse width control circuit comprises:
   a positive edge-triggered flip-flop operable to be clocked by the square wave clock signal, to receive the test data, and to output correctly sampled data;
   an error detection circuit having a first input operable to receive the latched data, a second input operable to receive the correctly sampled data, and an error output operable to provide an error signal indicative of whether the latched data contains errors; and
   a negative edge-triggered up-down counter operable to receive the error signal and to dynamically adjust the clock pulse width control signal based on the error signal.

15. The integrated circuit defined in claim 14, wherein the error detection circuit comprises an exclusive OR gate.

16. An integrated circuit comprising:
   a plurality of pulse latches;
   pulse width control circuitry operable to generate a pulse width control signal at an output, wherein the pulse width control circuitry includes a master pulse generator and a test latch; and
   a plurality of slave pulse generators, wherein each slave pulse generator has a control input that is coupled to the output of the pulse width control circuitry and wherein each slave pulse generator is operable to produce a pulse latch clock signal that has an adjustable pulse width and that is applied to an associated group of pulse latches in the plurality of pulse latches.

17. The integrated circuit defined in claim 16, wherein the master pulse generator is operable to generate a local clock pulse signal and wherein the pulse width control circuitry further comprises:
   a circuit operable to provide test data, wherein the test latch has a data input operable to receive the test data, a clock input operable to receive the local clock pulse signal, and a data output operable to provide latched data; and
   a pulse width control circuit having a first input operable to receive the test data, a second input operable to receive the latched data, and a control output operable to provide the pulse width control signal to dynamically adjust the adjustable pulse width.

18. The integrated circuit defined in claim 17, wherein the pulse width control circuit has an error detection circuit operable to compare the test data with the latched data.

19. The integrated circuit defined in claim 18, wherein the error detection circuit comprises an exclusive OR gate.

20. The integrated circuit defined in claim 16, wherein the master pulse generator is a replica of a slave pulse generator of the plurality of slave pulse generators and wherein the test latch is a replica of a pulse latch of the plurality of pulse latches.

* * * * *